(12) United States Patent
Fasano (10) Patent No.: US 12,476,063 B2
(45) Date of Patent: Nov. 18, 2025

(54) SPACING BRACKET FOR CIRCUIT BREAKER MOUNTED TO CIRCUIT BOARD

(71) Applicant: Carling Technologies, Inc., Plainville, CT (US)

(72) Inventor: Michael Fasano, Watertown, CT (US)

(73) Assignee: Carling Technologies, Inc., Plainville, CT (US)

( * ) Notice: Subject to any disclaimer, the term of this patent is extended or adjusted under 35 U.S.C. 154(b) by 267 days.

(21) Appl. No.: 18/214,034

(22) Filed: Jun. 26, 2023

(65) Prior Publication Data

US 2024/0006140 A1    Jan. 4, 2024

Related U.S. Application Data

(60) Provisional application No. 63/356,760, filed on Jun. 29, 2022.

(51) Int. Cl.
*H01H 71/02*    (2006.01)
*H05K 1/02*    (2006.01)

(52) U.S. Cl.
CPC ....... *H01H 71/0264* (2013.01); *H05K 1/0256* (2013.01)

(58) Field of Classification Search
None
See application file for complete search history.

(56) References Cited

U.S. PATENT DOCUMENTS

| | | | | |
|---|---|---|---|---|
| 4,713,728 A | * | 12/1987 | Raabe | H02B 1/056 361/652 |
| 6,062,914 A | * | 5/2000 | Fasano | H01H 71/08 361/635 |
| 2014/0148020 A1 | * | 5/2014 | Manushi | H01R 12/52 439/66 |
| 2017/0352513 A1 | * | 12/2017 | Eid | H01H 1/5805 |

* cited by examiner

*Primary Examiner* — Bernard Rojas
(74) *Attorney, Agent, or Firm* — KDW Firm PLLC (57) ABSTRACT

An assembly includes a circuit board having at least two conductor traces formed thereon, each of the conductor traces having at least one hole associated therewith, a circuit breaker having at least two conductive terminals, each of the conductive terminals having a screw-receiving threaded opening, the threaded openings being aligned with the holes formed in the circuit board, and a spacing bracket comprising a floor positioned between the circuit board and the circuit breaker when the circuit breaker is attached to the circuit board, the floor having at least two terminal receiving openings passing therethrough, the openings separated from one another by a barrier and being aligned with the threaded openings of the circuit breaker and the holes of the circuit board. The spacing bracket further includes an affixation member that affixes the spacing bracket to at least one of the printed circuit board and the circuit breaker.

20 Claims, 7 Drawing Sheets

SPACING BRACKET FOR CIRCUIT BREAKER MOUNTED TO CIRCUIT BOARD

CROSS REFERENCE TO RELATED APPLICATION

This application claims the benefit of priority to, U.S. Provisional Patent Application No. 63/356,760, filed Jun. 29, 2022, entitled "Spacing Bracket for Circuit Breaker Mounted to Circuit Board," which application is incorporated herein by reference in its entirety.

FIELD OF THE INVENTION

The invention relates to the field of printed circuit board mounted circuit breakers. More specifically, the invention relates to a spacing bracket adapted to mount a circuit breaker onto a printed circuit board while ensuring that minimum requirements for terminal spacing are satisfied.

BACKGROUND OF THE INVENTION

Circuit breakers are extremely well known devices designed to protect an electrical circuit and/or electrical devices connected to that electrical circuit from damage caused by excess current from an overload or short circuit. Essentially, the basic function of a circuit breaker is to interrupt current flow after a fault is detected. Unlike a fuse, which operates once and then must be replaced, a circuit breaker can be reset (either manually or automatically) to resume normal operation. Circuit breakers are made in varying sizes, from small devices that protect low-current circuits or individual household appliance, up to large switchgear designed to protect high voltage circuits feeding an entire city, and are designed for use in many varying environments.

One particular environment in which circuit breakers may be employed in in connection with printed circuit boards (PCBs), wherein the terminals of the circuit breakers are electrically connected to traces on the PCB, which form at lease part of the circuit being protected by the circuit breaker. In such cases, it is often desirable for the circuit breaker to be directly mounted on the PCB with the terminals of the circuit breaker making direct contact with traces on the PCB.

In such situations, however, there exists the risk of accidental shorts or arcs forming between the terminals of the circuit breaker if the terminals of different polarity are positioned too close together. As such, Underwriters Laboratories (UL), as well as other safety certification and/or regulating agencies, mandate minimum requirements for the spacing of circuit breaker terminals having different polarities.

Traditionally, these requirements have been met by manipulating the designs of traditional PCBs to incorporate relatively complex structures and configurations, thereby significantly increasing production complexity and costs of the PCBs and/or rendering them structurally weaker (e.g., by requiring one or more openings of relatively large size through the PCB substrates).

Accordingly, there is a need for a mounting arrangement for securely mounting a circuit breaker onto a PCB, while satisfying requirements for minimum spacing between terminals of different polarity, that requires as few modifications to traditional PCB designs as is practicable, that is relatively simple in design and, consequently, relatively inexpensive, and that results in less structural weakening of the PCB substrate than required by many previously known designs.

SUMMARY OF THE INVENTION

To this end, an assembly is provided, according to one aspect of the present invention, comprising a circuit board having at least two conductor traces formed thereon, each of the conductor traces having at least one hole associated therewith, a circuit breaker having at least two conductive terminals, each of the conductive terminals having a threaded opening, the threaded openings being aligned with the holes formed in the circuit board, and a spacing bracket comprising a floor positioned between the circuit board and the circuit breaker when the circuit breaker is attached to the circuit board, the floor having at least two terminal receiving openings passing therethrough, the openings separated from one another by a barrier and being aligned with the threaded openings of the circuit breaker and the holes of the circuit board. The spacing bracket further comprises an affixation member that affixes the spacing bracket to at least one of the printed circuit board and the circuit breaker. At least two screws are provided, each screw passing through one of the holes in the printed circuit board and one of the terminal receiving openings in the spacing bracket and engaging one of the threaded openings of the terminals of the circuit breaker, such that the screws clamp the circuit breaker, the spacing bracket and the circuit board together in an assembled configuration.

In some embodiments, when in the assembled configuration, the screws pull the conductive terminals of the circuit breaker into electrical communication with the conductive traces of the circuit board.

In some embodiments, the affixation member comprises at least one snap-fit tab extending from the spacing bracket. In certain of these embodiments, the circuit board includes at least one recess that engages the at least one snap-fit tab such that the at least one snap-fit tab affixes the spacing bracket to the printed circuit board. In certain embodiments, the affixation member comprises four snap-fit tabs and the printed circuit board includes four recesses that engage the four snap-fit tabs.

In some embodiments, the affixation member comprises at least one tab extending from the spacing bracket having a hole passing therethrough, and the circuit breaker comprises a housing and a rivet passing through the hole in the at least one tab so as to affix the spacing bracket to the housing of the circuit breaker. In certain of these embodiments, the affixation member comprises two tabs extending from the spacing bracket and the circuit breaker comprises two rivets affixing the spacing bracket to the housing of the circuit breaker. In certain embodiments, the housing of the circuit breaker comprises two halves, and the rivet at least partially joins the two halves together.

In some embodiments, the affixation member comprises a biased hinge formed in the spacing bracket adapted to affix the spacing bracket to the circuit breaker when the circuit breaker is inserted into the spacing bracket. In certain of these embodiments, the bias of the hinge formed in the spacing bracket is created by a torsion spring.

In some embodiments, the spacing bracket comprises a flexible seal. In certain of these embodiments, the affixation member comprises a recessed channel formed on an inner periphery of the spacing bracket. In certain of these embodiments, the circuit breaker comprises a housing having an outwardly extending peripheral lip, and the spacing bracket is affixed to the housing of the circuit breaker by engagement between the recessed channel of the spacing bracket and the lip of the circuit breaker. In certain embodiments, the flexible seal is formed from silicone rubber.

In accordance with another aspect of the present invention, a spacing bracket adapted to facilitate attachment of a circuit breaker to a circuit board is provided. The spacing bracket comprises a floor having at least two terminal receiving openings passing therethrough, the openings separated from one another by a barrier, a peripheral wall adapted to surround at least a portion of a housing of the circuit breaker, the peripheral wall being generally orthogonal to the floor, and an affixation member adapted to removably affix the spacing bracket to at least one of the printed circuit board and the circuit breaker. The spacing bracket is adapted to be disposed between the circuit breaker and the circuit broad when the circuit breaker it attached to the circuit board.

In some embodiments, the affixation member comprises at least one snap-fit tab extending from the spacing bracket adapted to mate with a recess provided in the circuit board.

In some embodiments, the affixation member comprises at least one tab extending from the spacing bracket having a hole passing therethrough adapted to receive a rivet affixed to a housing of the circuit breaker.

In some embodiments, the affixation member comprises a biased hinge formed in the spacing bracket adapted to affix the spacing bracket to the circuit breaker when the circuit breaker is inserted into the spacing bracket.

In some embodiments, the spacing bracket comprises a flexible seal. In certain of these embodiments, the affixation member comprises a recessed channel formed on an inner periphery of the spacing bracket adapted to engage an outwardly extending peripheral lip on a housing of the circuit breaker. In certain embodiments, the flexible seal is formed from silicone rubber.

In accordance with a more particular aspect of the present invention, an assembly comprises a circuit board having at least two conductor traces formed thereon, each of the conductor traces having at least one hole associated therewith, a circuit breaker comprising a housing and at least two conductive terminals, each of the conductive terminals having a threaded opening, the threaded openings being aligned with the holes formed in the circuit board, and the housing having an outwardly extending peripheral lip, and a spacing bracket comprising a floor positioned between the circuit board and the circuit breaker when the circuit breaker is attached to the circuit board, the floor having at least two terminal receiving openings passing therethrough, the openings separated from one another by a barrier and being aligned with the threaded openings of the circuit breaker and the holes of the circuit board. The spacing bracket comprises a flexible seal formed from silicone rubber, and the spacing bracket includes a recessed channel formed on an inner periphery thereof, the spacing bracket being affixed to the housing of the circuit breaker by engagement between the recessed channel of the spacing bracket and the lip of the circuit breaker. At least two screws are provided, each screw passing through one of the holes in the printed circuit board and one of the terminal receiving openings in the spacing bracket and engaging one of the threaded openings of the terminals of the circuit breaker, such that the screws clamp the circuit breaker, the spacing bracket and the circuit board together in an assembled configuration. When in the assembled configuration, the screws pull the conductive terminals of the circuit breaker into electrical communication with the conductive traces of the circuit board.

The present invention thus provides a mounting arrangement for securely mounting a circuit breaker onto a PCB, while satisfying requirements for minimum spacing between terminals of different polarity, that requires as few modifications to traditional PCB designs as is practicable, that is relatively simple in design and, consequently, relatively inexpensive, and that results in less structural weakening of the PCB substrate than required by many previously known designs.

Other objects of the invention and its particular features and advantages will become more apparent from consideration of the following drawings and accompanying detailed description.

DETAILED DESCRIPTION OF THE INVENTION

Referring now to the drawings, wherein like reference numerals designate corresponding structure throughout the views.

Figure 1:
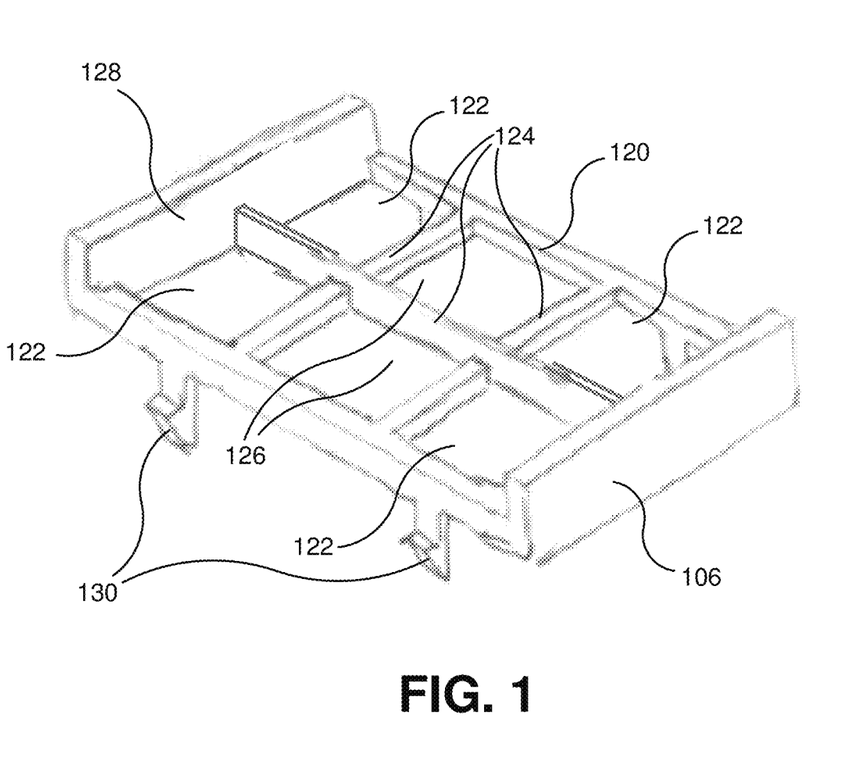
FIG. 1 is a side isometric view illustrating an exemplary spacing bracket portion of a circuit board mounted circuit breaker assembly constructed in accordance with the present invention.
Figure 2A:
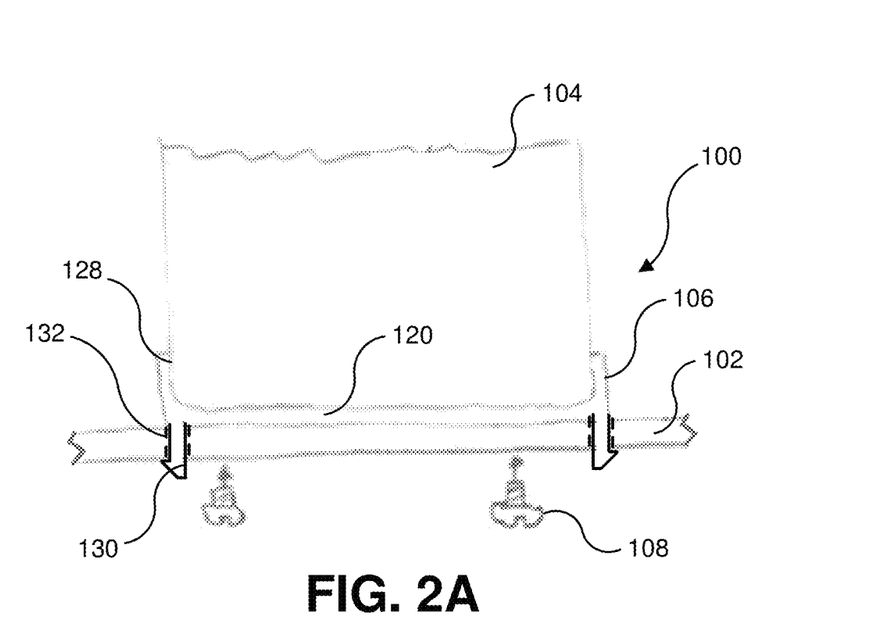
FIGS. 2A and 2B are side and end elevational views, respectively, of the exemplary circuit board mounted circuit breaker assembly, constructed in accordance with the present invention as shown in FIG. 1.
Figure 2B:
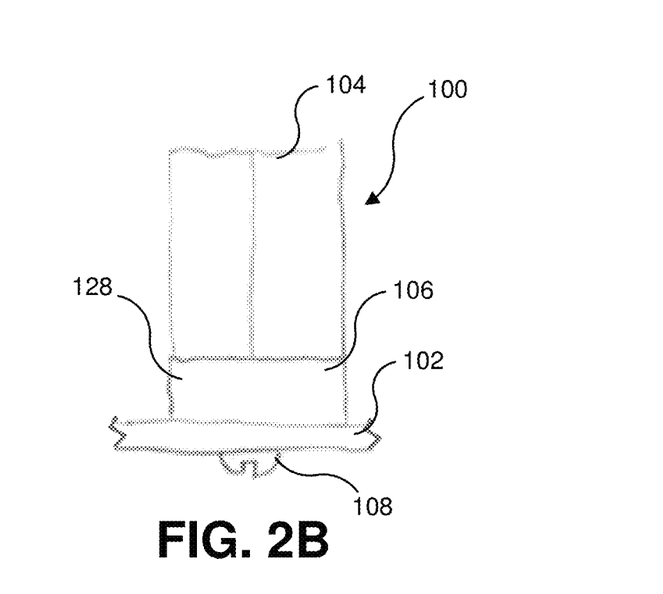
Figure 3:
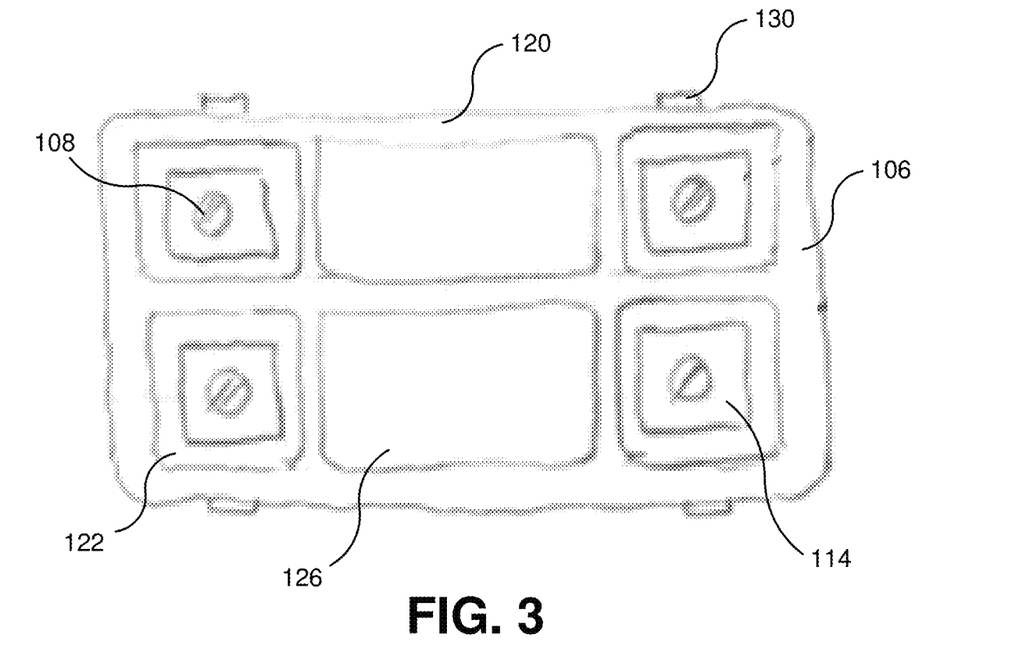
FIG. 3 is a bottom plan view of the exemplary circuit board mounted circuit breaker assembly, constructed in accordance with the present invention as shown in FIG. 1, with the circuit board omitted for clarity.

FIGS. 1-3 illustrate an exemplary circuit board mounted circuit breaker assembly (100), according to one aspect of the present invention, that includes four primary components: a circuit board (102), a circuit breaker (104), a spacing bracket (106) and at least two screws (108).

As the configuration of printed circuit boards (102) and their use in similar applications is extremely well-known, a detailed description thereof is not presented herein. Similarly, the circuit breaker (104) can take many forms, with it being understood that the illustrated embodiment is provided as an example only. As such, conventional components and/or components otherwise not particularly relevant to the inventive aspects hereof are only briefly described, or are not described at all.

Figure 4A:
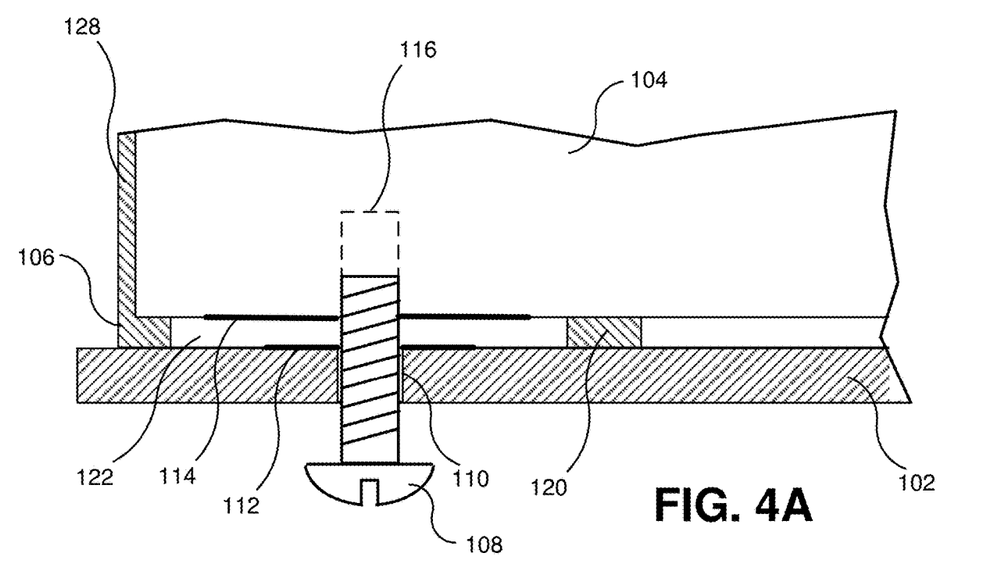
FIGS. 4A and 4B are side elevational views, partially broken away, of relevant portions of the exemplary circuit board mounted circuit breaker assembly of FIGS. 1-3 shown with a screw portion thereof pulling various components into electrical and physical contact.
Figure 4B:
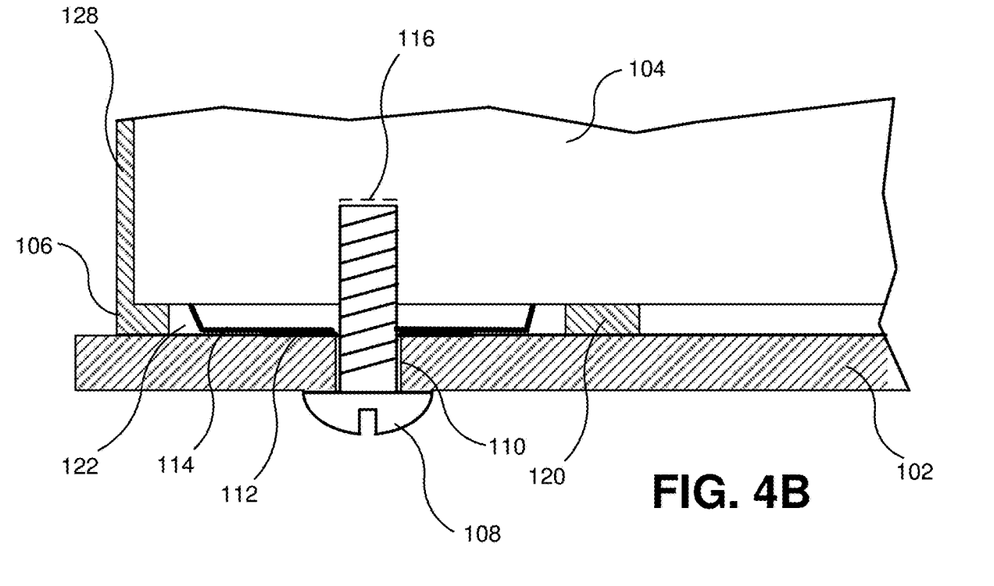

What is relevant to the present invention, however, is that the circuit board has at least two conductor traces (112) formed thereon, each of the conductor traces (112) having at least one hole (110) associated therewith, as best seen in FIGS. 4A and 4B. More than two conductor traces (112) and/or more than two holes (110) can be provided, for example, if multiple circuit breakers (104) are to be mounted on the same circuit board (102) and/or if the circuit breaker (104) has more than two terminals. However, all that is required to provide for the terminal separation contemplated by the present invention as that at least two terminals, traces and corresponding holes be provided.

Also relevant to the present invention is that the circuit breaker (104) has at least two conductive terminals (114), each of the conductive terminals (114) having a threaded opening (116) with threads sized and shaped to correspond to the screws (108), as best seen in FIGS. 4A and 4B. The threaded openings (116) in the terminals (114) are aligned with the holes (110) formed in the circuit board (102) when the circuit breaker (104) and the circuit board (102) are in an assembled configuration (as shown in FIGS. 2B and 4B).

The spacing bracket (106) includes a floor (120) positioned between the circuit board (102) and the circuit breaker (104) when the circuit breaker (104) and the circuit board (102) are in the assembled configuration (i.e., when the circuit breaker (104) is attached to the circuit board (102)). The floor (120) has at least two terminal receiving openings (122) passing therethrough, the openings (122) separated from one another by a barrier (124) and being aligned with the threaded openings (116) of the circuit breaker (104) and the holes (110) of the circuit board (102) when the circuit breaker (104), the circuit board (102) and the spacing bracket (106) are in the assembled configuration.

The spacing bracket (106) may include, in addition to the terminal receiving openings (122), one or more additional openings (126), which may be provided for a variety of reasons. For example, the additional openings (126) require less materials to be used to create the spacing bracket (106), thereby generally meaning reduced weight and cost of materials, may provide an air gap resulting in insulating benefits, may result in gaps so as to not interfere with structures provided on the printed circuit board (102), etc.

Extending generally orthogonally from the floor (120) of the spacing bracket (106) is at least one side wall (128). The side wall (128) may extend completely around the periphery of the floor (120), or may be provided only on some edges of the floor (120). In the embodiment shown in FIGS. 1-3, for example, side walls (128) are provided only on the two opposite ends of the spacing bracket (106) for engaging the ends of the circuit breaker (104) and aiding in the proper positioning of the circuit breaker (104) with respect to the spacing bracket (106) and the circuit board (102).

A noted above, at least two screws (108) are provided, each screw (108) passing through one of the holes (110) in the printed circuit board (102) and one of the terminal receiving openings (122) in the spacing bracket (106) and engaging one of the threaded openings (116) of the terminals (114) of the circuit breaker (104).

The screws (108) clamp the circuit breaker (104), the spacing bracket (106) and the circuit board (102) together mechanically in the assembled configuration. Additionally, as best seen by comparing FIG. 4A with 4B, when in the assembled configuration, further tightening of the screws (108) pulls the conductive terminals (114) of the circuit breaker (104) into electrical communication with the conductive traces (112) of the circuit board (102).

More specifically, FIG. 4A shows the situation where the circuit breaker (104), the spacing bracket (106) and the circuit board (102) are all fully seated in the assembled configuration, but the screws (108) have not yet been fully tightened. As can be seen, the conductive terminals (114) of the circuit breaker (104) and the conductive traces (112) of the circuit board (102) are not yet in contact, but rather are separated by a distance generally equal to a thickness of the floor (120) of the spacing bracket.

Turning now to FIG. 4B, the screw (108) has been tightened, which has now pulled the conductive terminals (114) of the circuit breaker (104) into physical contact with, and consequently electrical communication with, the conductive traces (112) of the circuit board (102). Toward this end, as will be recognized by those skilled in the art, the conductive terminals (114) may be configured to be floating within the housing of the circuit breaker (104) and/or may be configured to be flexible, as least enough to be able to flex into contact with the conductive traces (112) of the circuit board (102)—i.e., the position shown in FIG. 4B—when the screws (108) are tightened. In either event, tightening of the screws (108) clamps the circuit breaker (104), the spacing bracket (106) and the circuit board (102) together mechanically as well as electrically in the assembled configuration.

The spacing bracket (106) further includes an affixation member that affixes the spacing bracket (106) to at least one of the printed circuit board (102) and/or the circuit breaker (104) at least long enough and in secure enough fashion to allow the circuit breaker (104), the spacing bracket (106) and the circuit board (102) to be aligned in the assembled configuration and then for the screws (108) to be tightened so as to clamp the circuit breaker (104), the spacing bracket (106) and the circuit board (102) together mechanically as well as electrically in the assembled configuration, as described above.

Referring specifically to the configuration shown in FIGS. 1-3, the affixation member comprises at least one snap-fit tab (130) extending from the floor (120) of the spacing bracket (106) in a direction opposite to the direction in which the at least one side wall (128) extends. The circuit board (102) includes at least one recess/opening (132) that engages the at least one snap-fit tab (130) such that the at least one snap-fit tab (130) affixes the spacing bracket (106) to the printed circuit board (102) so as to facilitate alignment of the circuit breaker (104), the spacing bracket (106) and the circuit board (102) together mechanically as well as electrically in the assembled configuration.

In this regard, the spacing bracket (106) may be affixed to the printed circuit board (102) employing the cooperating snap-fit tab(s) (130) and corresponding recess(es) (132), and then the circuit breaker (104) may be positioned appropriately within the spacing bracket (106) with the aid of the at least one side wall (128). Once properly positioned, the screws (108) may be inserted and tightened in order to clamp the circuit breaker (104), the spacing bracket (106) and the circuit board (102) together mechanically as well as electrically in the assembled configuration, as described above.

In the particular embodiment shown in FIGS. 1-3, four snap-fit tabs (130) are provided, and the printed circuit board includes four corresponding recesses (132) that engage the four snap-fit tabs (130). However, a greater or lesser number of snap-fit tabs (130) and recesses (132) may be provided.

Preferably, the spacing bracket (106) is made from a polymer material that has properties conducive to operation of the snap-fit tabs (130). For example, the material must be flexible enough to allow for the tabs (130) to be snapped into engagement with the recesses (132) in the printed circuit board (102) without fracturing, but rigid enough to affix the spacing bracket (106) in position. Additionally, the material must provide enough structural support to allow the screws (108) to pull the conductive terminals (114) of the circuit breaker (104) into electrical communication with the conductive traces (112) of the circuit board (102) as they are tightened, as described above in connection with FIGS. 4A and 4B. Furthermore, the material must have insulating properties in order to provide electrical separation between the terminals and inhibit shorts, arcing or the like.

Figure 5A:
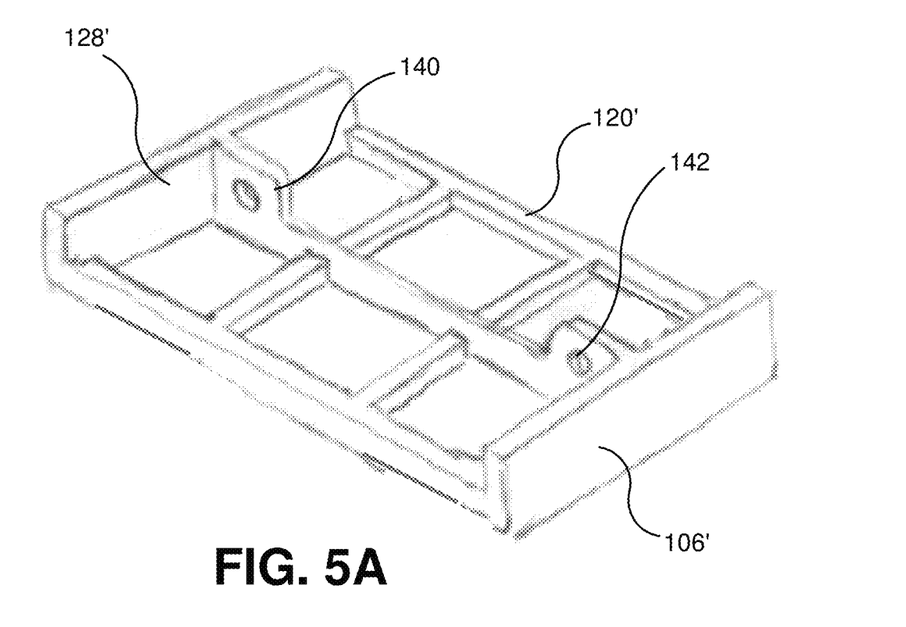
FIGS. 5A and 5B are a side isometric view, and an end elevational view, respectively illustrating portions of another exemplary circuit board mounted circuit breaker assembly constructed in accordance with the present invention.
Figure 5B:
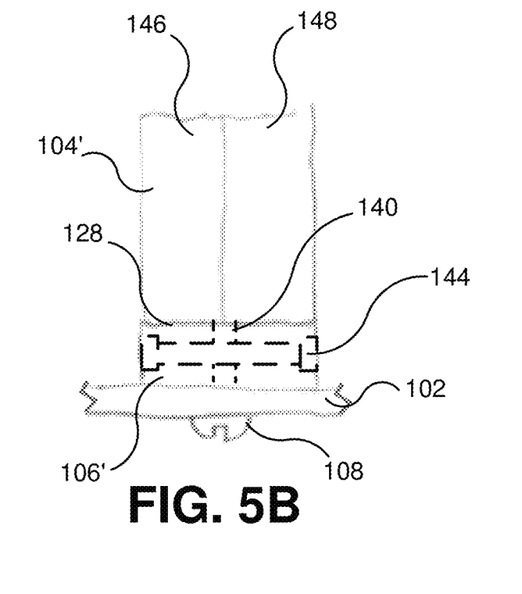

Turning now to FIGS. 5A and 5B, the spacing bracket (106') shown therein is very similar to the spacing bracket (106) shown in FIGS. 1-3, with the exception that the affixation member, instead of snap-fit tabs (130), takes the form of at least one tab (140) extending from the floor (120') of the spacing bracket (106') in the same direction in which the at least one side wall (128') extends. In fact, in the particular embodiment shown, the tabs (140) extend from both the floor (120') of the spacing bracket (106') and the side wall (128').

Each tab (140) has a hole (142) passing therethrough, which is adapted to receive a rivet (144) provided in a housing of the circuit breaker (104) so as to affix the spacing bracket (106') to the housing of the circuit breaker (104) in order to facilitate alignment of the circuit breaker (104), the spacing bracket (106') and the circuit board (102) together mechanically as well as electrically in the assembled configuration.

In this regard, the spacing bracket (106') may be affixed to the circuit breaker (104) employing the tabs (140), and then the combined circuit breaker (104) and spacing bracket (106') may be positioned appropriately on the circuit board (102). Once properly positioned, the screws (108) may be inserted and tightened in order to clamp the circuit breaker (104), the spacing bracket (106') and the circuit board (102) together mechanically as well as electrically in the assembled configuration, as described above.

In the particular embodiment illustrated, the affixation member comprises two tabs (140), which are adapted to receive two rivets (144) provided in the housing of the circuit breaker (104'). This configuration is particularly suitable when the housing of the circuit breaker (104') comprises two halves (146, 148), and the rivets (144) at least partially join the two halves (146, 148) together, as is a very well-known construction for conventional circuit breakers.

Figure 6A:
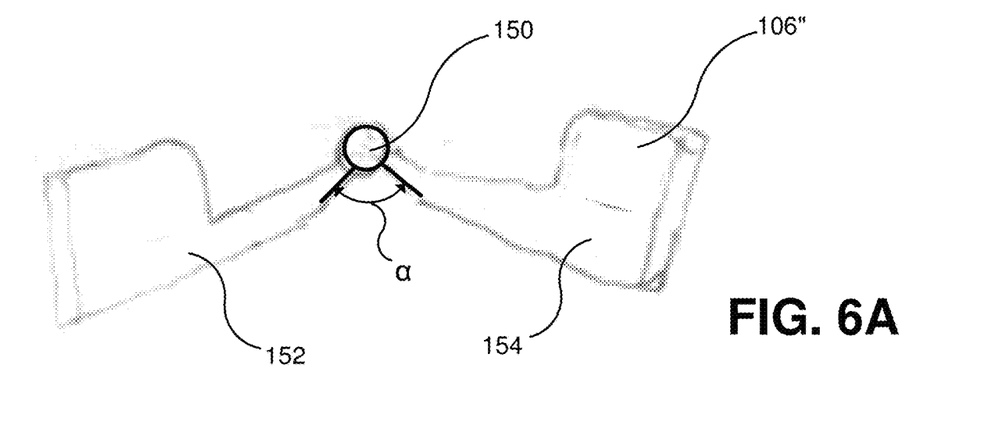
FIGS. 6A-6C are side isometric, top plan and side isometric installed views, respectively, of portions of another exemplary circuit board mounted circuit breaker assembly constructed in accordance with the present invention.
Figure 6B:
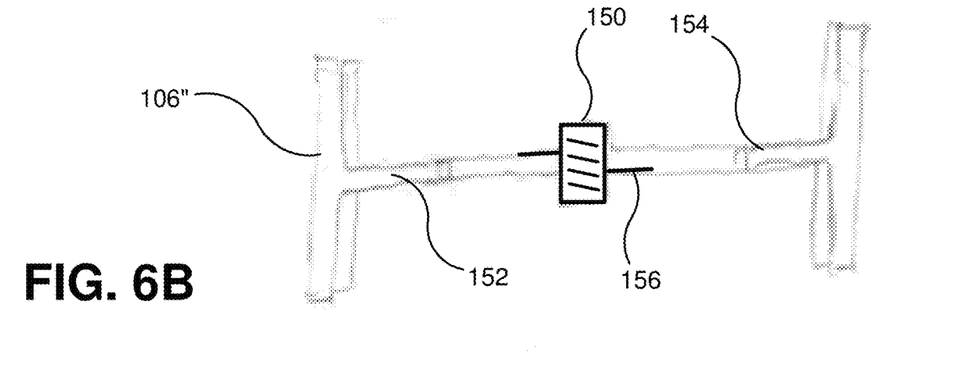
Figure 6C:
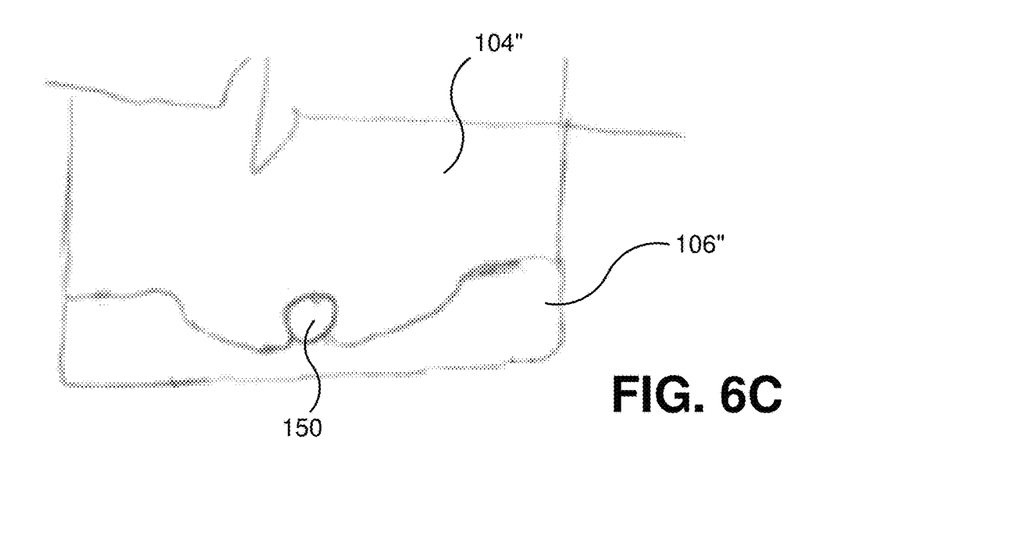

Turning now to FIGS. 6A-6C, the spacing bracket (106") shown therein employs no tabs (130, 140). Instead, the affixation member of the spacing bracket (106") comprises a biased hinge (150) formed in the spacing bracket (106") adapted to affix the spacing bracket (106") to the circuit breaker (104") when the circuit breaker (104") is inserted into the spacing bracket (106").

FIG. 6A shows the spacing bracket (106") in its state prior to the circuit breaker (104") being inserted. As can be seen, the spacing bracket (106") has two wings (152, 154) that are biased to be angled with respect to one another by an angle (a) in this relaxed configuration. As best seen in FIG. 6B, this bias may be achieved by provision of a torsion spring (156).

As shown in FIG. 6C, when the circuit breaker (104") is inserted into the spacing bracket (106"), the wings (152, 154) are moveable against the bias of the hinge, such that the wings (152, 154) are generally coplanar (i.e., the angle (a) is 180 degrees). In this position, the bias exerts a clamping force on the circuit breaker (104"), so as to affix the spacing bracket (106") to the circuit breaker (104") in order to facilitate alignment of the circuit breaker (104"), the spacing bracket (106") and the circuit board (102) together mechanically as well as electrically in the assembled configuration.

In this regard, the spacing bracket (106") may be affixed to the circuit breaker (104") employing the bias of the hinge, and then the combined circuit breaker (104") and spacing bracket (106") may be positioned appropriately on the circuit board (102). Once properly positioned, the screws (108) may be inserted and tightened in order to clamp the circuit breaker (104"), the spacing bracket (106") and the circuit board (102) together mechanically as well as electrically in the assembled configuration, as described above.

Figure 7A:
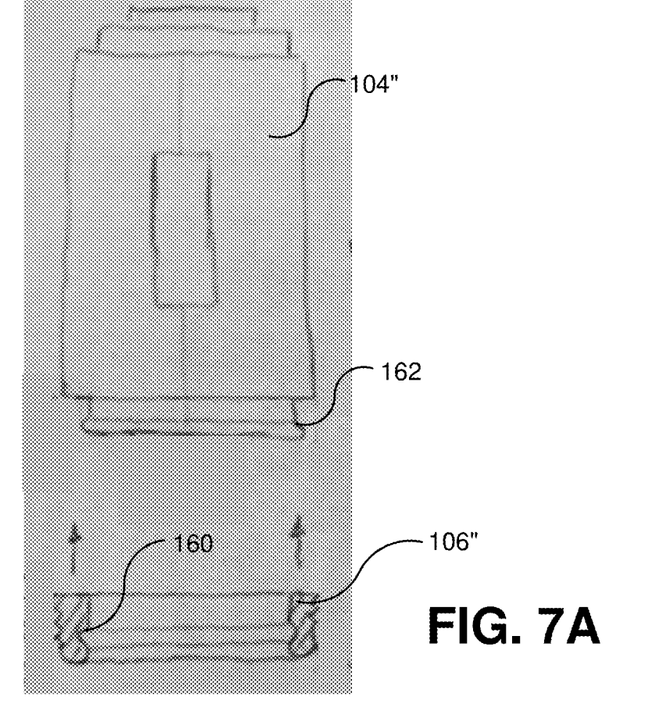
FIGS. 7A and 7B are end elevational views, partially broken away, of relevant portions of another exemplary circuit board mounted circuit breaker assembly constructed in accordance with the present invention.
Figure 7B:
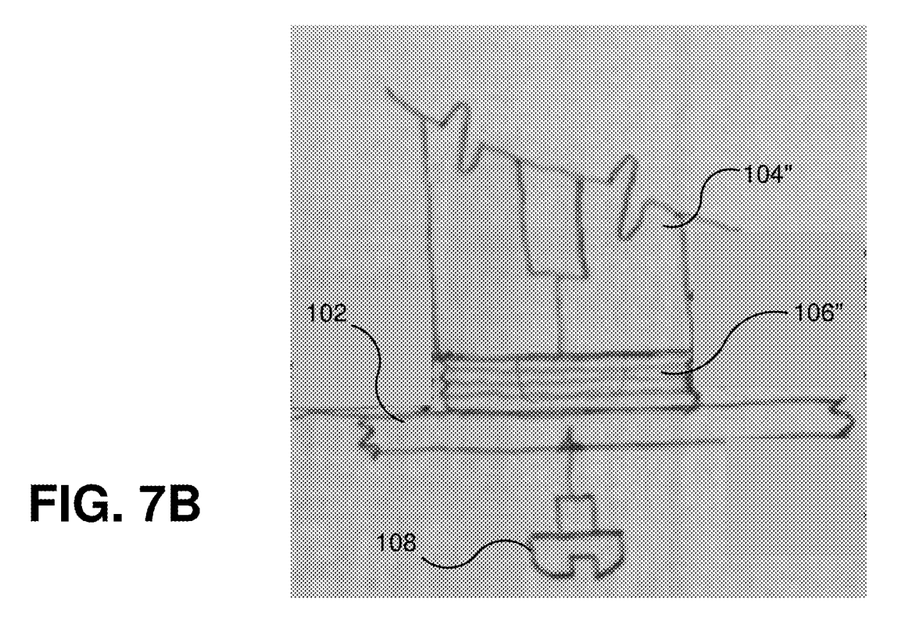

Turning now to FIGS. 7A and 7B, the spacing bracket (106''') shown therein employs no tabs (130, 140) or biased hinge (150). Instead, the spacing bracket (106''') comprises a flexible seal, and the affixation member takes the form of a recessed channel (160) formed on an inner periphery of the spacing bracket (106'''). When such is the case, the circuit breaker (104''') comprises a housing having an outwardly extending peripheral lip (162), and the spacing bracket (106''') is affixed to the housing of the circuit breaker (104''') by engagement between the recessed channel (160) of the spacing bracket (106''') and the lip (162) of the circuit breaker (104''').

The spacing bracket (106'''), taking the form of a flexible seal, is formed from a flexible material, that is flexible enough to allow the spacing bracket (106''') to be stretched around the lip (162) of the circuit breaker, but rigid enough for the lip (162) to engage the recessed channel (160) formed in the spacing bracket (106''') in order to affix the spacing bracket (106''') in place on the circuit breaker (104'''). It has been found that silicone rubber provided the desired results, although other materials may also be employed.

Similar to the previous embodiments, once the spacing bracket (106''') is affixed to the circuit breaker (104''') by cooperation of the lip (162) of the circuit breaker (104''') and the recessed channel (160) of the spacing bracket (106'''), the combined circuit breaker (104''') and spacing bracket (106''') may be positioned appropriately on the circuit board (102). Once properly positioned, the screws (108) may be inserted and tightened in order to clamp the circuit breaker (104'''), the spacing bracket (106''') and the circuit board (102) together mechanically as well as electrically in the assembled configuration, as described above.

The present invention thus provides a mounting arrangement for securely mounting a circuit breaker onto a PCB, while satisfying requirements for minimum spacing between terminals of different polarity, that requires as few modifications to traditional PCB designs as is practicable, that is relatively simple in design and, consequently, relatively inexpensive, and that results in less structural weakening of the PCB substrate than required by many previously known designs.

Although the invention has been described with reference to a particular arrangement of parts, features and the like, these are not intended to exhaust all possible arrangements or features, and indeed many other modifications and variations will be ascertainable to those of skill in the art.

What is claimed is:

1. An assembly comprising:
   a circuit board having at least two conductor traces formed thereon, each of the conductor traces having at least one hole associated therewith;
   a circuit breaker having at least two conductive terminals, each of the conductive terminals having a threaded opening, the threaded openings being aligned with the holes formed in said circuit board;

a spacing bracket comprising a floor positioned between said circuit board and said circuit breaker when said circuit breaker is attached to said circuit board, the floor having at least two terminal receiving openings passing therethrough, the openings separated from one another by a barrier and being aligned with the threaded openings of said circuit breaker and the holes of said circuit board;

wherein said spacing bracket further comprises an affixation member that affixes said spacing bracket to at least one of the printed circuit board and the circuit breaker; and at least two screws, each screw passing through one of the holes in said printed circuit board and one of the terminal receiving openings in said spacing bracket and engaging one of the threaded openings of the terminals of the circuit breaker, such that the screws clamp said circuit breaker, said spacing bracket and said circuit board together in an assembled configuration.

2. The assembly of claim 1, wherein, when in the assembled configuration, the screws pull the conductive terminals of said circuit breaker into electrical communication with the conductive traces of said circuit board.

3. The assembly of claim 1 wherein said affixation member comprises at least one snap-fit tab extending from said spacing bracket.

4. The assembly of claim 3 wherein said circuit board includes at least one recess that engages the at least one snap-fit tab such that the at least one snap-fit tab affixes said spacing bracket to said printed circuit board.

5. The assembly of claim 4 wherein said affixation member comprises four snap-fit tabs and wherein said printed circuit board includes four recesses that engage the four snap-fit tabs.

6. The assembly of claim 1 wherein said affixation member comprises at least one tab extending from said spacing bracket having a hole passing therethrough, and wherein said circuit breaker comprises a housing and a rivet passing through the hole in the at least one tab so as to affix said spacing bracket to the housing of said circuit breaker.

7. The assembly of claim 6 wherein said affixation member comprises two tabs extending from said spacing bracket and wherein said circuit breaker comprises two rivets affixing said spacing bracket to the housing of said circuit breaker.

8. The assembly of claim 6 wherein the housing of said circuit breaker comprises two halves, and wherein the rivet at least partially joins the two halves together.

9. The assembly of claim 1 wherein said affixation member comprises a biased hinge formed in said spacing bracket adapted to affix said spacing bracket to said circuit breaker when said circuit breaker is inserted into said spacing bracket.

10. The assembly of claim 9 wherein the bias of the hinge formed in said spacing bracket is created by a torsion spring.

11. The assembly of claim 1 wherein said spacing bracket comprises a flexible seal.

12. The assembly of claim 11 wherein said affixation member comprises a recessed channel formed on an inner periphery of said spacing bracket.

13. The assembly of claim 12 wherein said circuit breaker comprises a housing having an outwardly extending peripheral lip, and wherein said spacing bracket is affixed to the housing of said circuit breaker by engagement between the recessed channel of said spacing bracket and the lip of said circuit breaker.

14. The assembly of claim 11 wherein the flexible seal is formed from silicone rubber.

15. A spacing bracket adapted to facilitate attachment of a circuit breaker to a circuit board, said spacing bracket comprising:

a floor having at least two terminal receiving openings passing therethrough, the openings separated from one another by a barrier;

a peripheral wall adapted to surround at least a portion of a housing of the circuit breaker, said peripheral wall being generally orthogonal to said floor; and an affixation member adapted to removably affix said spacing bracket to at least one of the printed circuit board and the circuit breaker;

wherein said spacing bracket is adapted to be disposed between the circuit breaker and the circuit broad when the circuit breaker it attached to the circuit board;

wherein said affixation member comprises at least one snap-fit tab extending from said spacing bracket adapted to mate with a recess provided in the circuit board.

16. The spacing bracket of claim 15 wherein said affixation member comprises at least one tab extending from said spacing bracket having a hole passing therethrough adapted to receive a rivet affixed to a housing of the circuit breaker.

17. The spacing bracket of claim 15 wherein said affixation member comprises a biased hinge formed in said spacing bracket adapted to affix said spacing bracket to the circuit breaker when the circuit breaker is inserted into said spacing bracket.

18. The spacing bracket of claim 15 wherein said spacing bracket comprises a flexible seal.

19. The assembly of claim 18 wherein said affixation member comprises a recessed channel formed on an inner periphery of said spacing bracket adapted to engage an outwardly extending peripheral lip on a housing of the circuit breaker.

20. The assembly of claim 19 wherein the flexible seal is formed from silicone rubber.

* * * * *